United States Patent [19]

Hollander

[11] Patent Number: 5,111,002
[45] Date of Patent: May 5, 1992

[54] METHOD OF FABRICATING THERMOCOUPLE CABLE AND THE CABLE RESULTING THEREFROM

[75] Inventor: Milton B. Hollander, Stamford, Conn.

[73] Assignee: Omega Engineering, Inc., Stamford, Conn.

[21] Appl. No.: 646,283

[22] Filed: Jan. 28, 1991

[51] Int. Cl.⁵ .......................... H01B 7/18; H01C 1/03
[52] U.S. Cl. .................... 174/102 P; 29/615; 136/230; 136/242; 156/50; 156/54; 174/106 R; 174/107; 174/118; 338/238
[58] Field of Search ............... 174/102 P, 107, 118, 174/106 R; 136/230, 232, 242; 338/238, 242; 156/50, 54; 29/615, 616

[56] References Cited

U.S. PATENT DOCUMENTS

| | | | |
|---|---|---|---|
| 3,121,038 | 2/1964 | Perotte | 156/48 |
| 3,205,296 | 9/1965 | Davis et al. | 136/230 |
| 3,329,534 | 7/1967 | Adler et al. | 136/233 |
| 3,353,260 | 11/1967 | Davis et al. | 136/230 |
| 3,463,674 | 8/1969 | Black et al. | 136/233 |
| 3,538,596 | 11/1970 | Davis et al. | 136/230 |
| 4,407,065 | 10/1983 | Gray | 156/54 X |
| 4,485,263 | 11/1984 | Itoyama et al. | 136/230 |
| 4,689,443 | 8/1987 | Bailleul | 174/102 P |
| 4,778,537 | 10/1988 | Thom et al. | 136/232 X |
| 4,909,855 | 3/1990 | Burley | 136/242 X |

*Primary Examiner*—Morris H. Nimmo
*Attorney, Agent, or Firm*—Bruce E. Hosmer

[57] ABSTRACT

An improvement in the method for preparing diffusion resistant clad thermocouple cable by placing the thermocouple wires in MgO powder or pellets on a strip of metal cladding material and longitudinally bending the strip of cladding material around the thermocouple wire and the MgO and welding the resulting seam closed is achieved when the resulting composite cable is placed on a second metal cladding strip such that when the second strip is bent longitudinally around the composite cable the resulting seam is displaced from the welded seam of the first cladding strip.

5 Claims, 1 Drawing Sheet

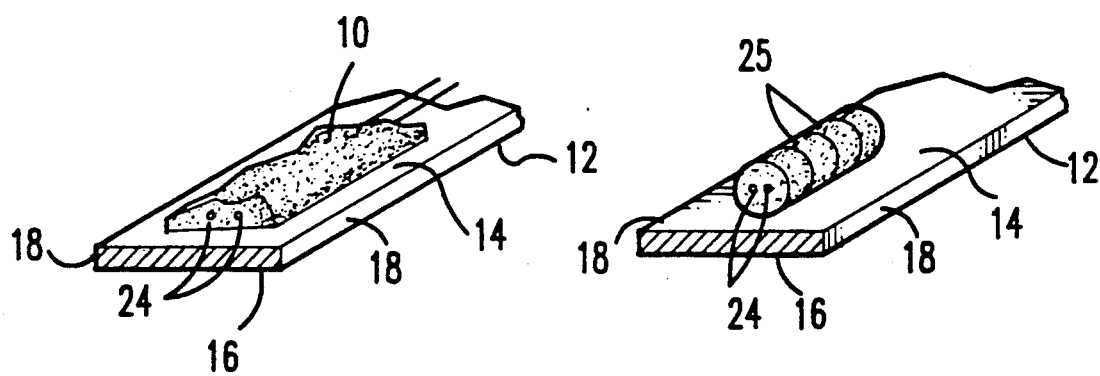
FIG. 1
FIG. 2
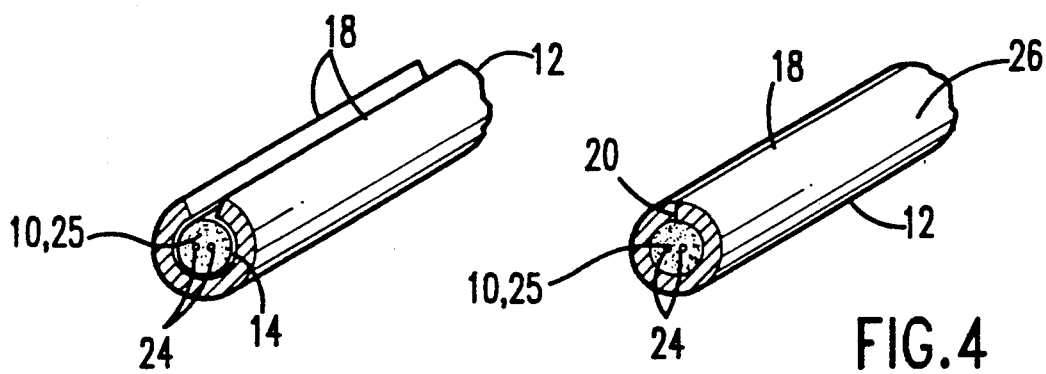
FIG. 3
FIG. 4
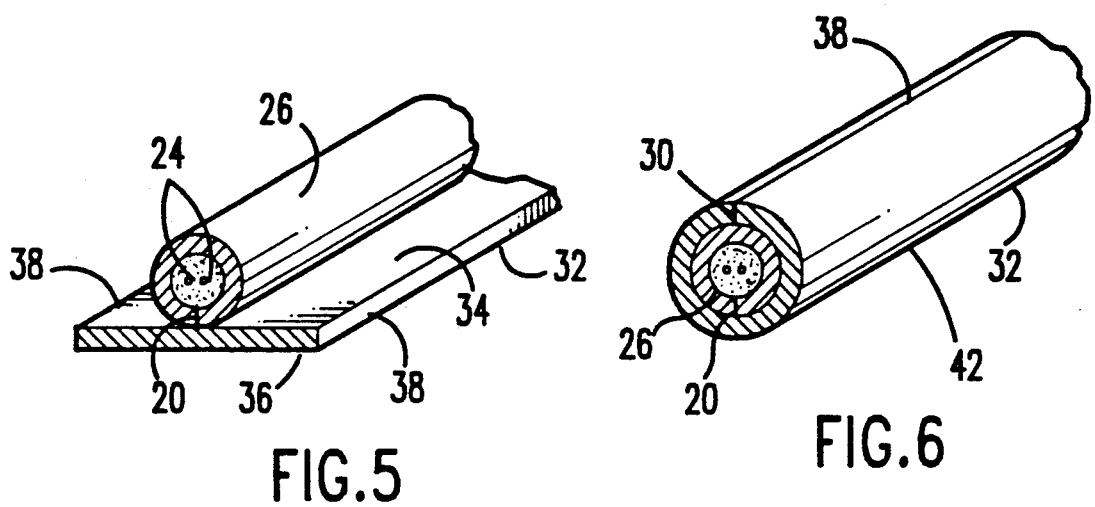
FIG. 5
FIG. 6

METHOD OF FABRICATING THERMOCOUPLE CABLE AND THE CABLE RESULTING THEREFROM

BACKGROUND OF THE INVENTION

The invention relates to an improved method of manufacturing clad thermocouple cable consisting of a first preferred metal sheath surrounding the thermocouple wires and insulating material, either in powered form or as pellets threaded along the wire, wherein the metal sheath has a longitudinally welded seam further surrounded by an outer protective second sheath.

The making of thermocouple cables by placing an insulating material and the thermocouple wires inside of a sheath and the subsequent drawing down of the sheath to form the final desired diameter of cable/wire has been accomplished both through the use of tubing and subsequently by the use of longitudinally and/or spirally rolled and welded metal strips as sheathing material. The difficulty in the use of strips of metal sheathing and then either spirally or longitudinally rolling them around the insulating material and thermocouple wires has been in creating a continuous uninterrupted final welded seam that does not contain discontinuities resulting in detrimental diffusion between the thermocouple cable and its surounding environment through the welded seam. Further the materials used to clad the insulating material and thermocouple wires are usually designed for a specific purpose or coatings are applied to the strip to be used as the cladding material to provide a resistance barrier and as such the material or coating are expensive to use and/or apply. Any discontinuities in the welding of the seam are detrimental to the operation and longevity of the resulting thermocouple cable and defeat the purposes for the use of the expensive cladding material or for the application of the barrier coatings.

SUMMARY OF THE INVENTION

The invention provides a method which is technically much simpler than the known methods and in addition yields a thermocouple cable which has the same characteristics but is made at a much lower cost in time and materials with a next to no product rejection for discontinuous welds.

In the method according to the invention the wrapped wire is manufactured by starting from a ribbon strip of the sheath material and folding this strip around the filling of the insulating material and thermocouple wires.

In this method rather narrow strips may be used as starting material, a thermocouple with a very small diameter being thus obtained. Some reduction is then desired to obtain a good compression of the insulating material around the thermocouple wire.

The so-called folding wire technique has been known for years in the manufacture of filled welding rods, thermocouple wire and other types of multi-component composite and insulated wires. A significant drawback to this technique has been the fact that the wire ends up with a longitudinal seam that must be sealed and that finished seam can be discontinuous thereby allowing the protected materials to have contact with the working environment as a result of diffusion through the defects in the welded seam which results in the degradation of the sheath protected materials. It is quite different in the thermocouple cable manufactured according to the invention. In this case the thermocouple cable is sheathed in a second layer of material using the same folding wire technique or alternatively it could be placed in a tube before final drawing down or a continuous outer coating may be applied. The cable sheathed with the first strip is placed on the second sheath material strip so that the orientation of the welded seam is displaced from the location of the seam that will be welded when the second sheath is rolled over the clad thermocouple or the tube or continuous coating cover the seam. This improvement thereby prevents the occurrence of any diffusion through weld defects in the seam of the first sheath layer.

It is therefore one object of the invention to provide an improved method for preparing a composite thermocouple cable of an insulating material and thermocouple wires using a longitudinally welded sheath.

It is another object of this invention to prevent the degradation of the thermocouple cable by environmental diffusion through weld defects in the cladding of the cable.

It is another object of the invention to provide an improved method for preparing a composite thermocouple cable of an insulating material and thermocouple wires using a longitudinally welded sheath containing an minimum thickness of an inner expensive cladding and an outer supporting thickness of a less expensive material.

BRIEF DESCRIPTION OF THE DRAWINGS

FIGS. 1 through 6 are perspective views showing the sequence of steps for the preparation of the double clad composite thermocouple cable.

DESCRIPTION OF THE PREFERRED EMBODIMENT

These and other objects of the invention may be met by longitudinally bending a strip of 1018 steel around two spaced thermocouple wires either using powered MgO of a size range between 220 grit and 350 grit or by threading the wires through pierced pellets of MgO having a diameter between 0.062 and 0.375 inch so that the longitudinal edges meet to form a mechanical bond between the two edges of the strip giving the clad thermocouple cable a circular cross section. The width of the strip of sheathing material is about equal to the circumference of the uncompressed wires and MgO material.

Referring now to the drawings, FIGS. 1 to 6 show the sequence of steps in forming the thermocouple cable. In FIG. 1. powdered insulating material (MgO) 10 is positioned on the metal cladding strip 12 and surround thermocouple wires 24 having upper or inner face 14 and lower or outer face 16 and longitudinal edges 18. The width of strip 12 is about equal to the circumference of the MgO powder 10 and thermocouple wires 24. FIG. 2 shows shows pelletized MgO 25 with thermocouple wires 24 theaded through said pellets positioned on the metal cladding strip 12 having upper or inner face 14 and lower or outer face 16 and longitudinal edges 18. The width of strip 12 is about equal to the circumference of the threaded MgO pellets 25. FIG. 3 shows strip 12 bent longitudinally almost completely around the composite of the MgO 10 or 25 and the thermocouple wires 24. In FIG. 4 the longitudinal edges 18 of strip 12 are butted to form joint 20 which must then be bonded to complete the composite thermocouple cable 26. FIG. 5, shows the clad thermocouple cable 26 positioned on the second metal cladding strip 32 with its welded seam 20 in contact with the upper or inner face 34 of the metal cladding strip 32 also having lower or outer face 36 and longitudinal edges 38. The width of strip 32 is about equal to the circumference of the clad thermocouple cable 26. FIG 6 shows the longitudinal edges 38 of strip 32 are butted to form joint 30 which must then be welded to complete the double clad composite thermocouple cable 42.

The metal strips 12 and 32 may be bent or rolled longitudinally around the MgO 10/25 and thermocouple wires 24 by any convenient method known to those in the art for forming bound tube or pipe from metal strips such as roll forming, center forming or true radius forming. It is important that there be good mechanical contact between the sheath and the thermocouple composite/cable. Preferably the two longitudinal edges of the metal strip forming the butt joint should be joined together to prevent their separation during subsequent operations on the clad thermocouple cable. The edges may be joined by any convenient welding means, using heat such as gas, arc, tig or resistance welding or by cold-joining methods such as vacuum-welding or diffusion-bonding without vacuum.

The thermocouple wires can be any of the types such as iron and constantan. Although MgO is a preferred material for use with the thermocouple wires, materials such as $Al_2O_3$ and $Y_2O_3$ are also suitable. The first sheating material would be selected from the group of metals that act as insulators, materials thermally compatible with and complimentary to thermoelectric conductors, molybdenum and other materials that have a specialized function in the production and protection of thermocouple cable while the second sheathing material would be selected from materials that would provide protection to the first sheathing material from the environment in which the thermocouple cable will be used such as stainless steel, platinum and other metals suitable for such protection in addition continuous plastic type coatings applied electrostatically or by extrusion, including polytetrafluoroethylene (Teflon) epoxy and nylon, can be used for the outer sheath for environmental and/or for electrical insulation of the inner sheath.

The following example is given as illustrative of the method of the invention and is not to be taken as limiting the scope of the invention which is defined by the appended claims.

EXAMPLE

A ribbon of 1018 steel which is 18 mils thick and 0.938 inches in width is formed longitudinally around MgO pellets of the diameter of 0.265 inches through which are threaded two thermocouple wires of iron and constantan composition. The seam is tig welded. The welded tube is then drawn to a smaller diameter through a series of dies to a finish size of 0.250 inches. The resulting clad thermocouple cable is placed, seam side down on a ribbon of 304 stanless steel which is 18 mils thick and 0.938 inches wide. The ribbon of 304 stainless steel is formed longitudinally around the clad thermocouple cable and the same is tig welded. The resulting double clad thermocouple cable is them drawn down through a series of dies to a finished size of 0.250 inches diameter. The resulting thermocouple cable is of the J type.

As can be seen from the above discussion and example, the method of the invention provides an economical and effective method for the preparation of clad thermocouple cable with an inner cladding of expensive preferred material and an outer cladding of a less expensive material and it also provides an economical and effective method for using seam welding and still achieving a secure diffusion barrier to defects in the welded seam.

The specification and drawings herein set forth clearly and fully describe a preferred embodiment of this invention, but it should be readily apparent to those having skill in this art that other forms, embodiments and variations thereof may be conceived and constructed without departing from the spirit and scope of the following claims.

What is claimed is:

1. An improved double clad thermocouple cable comprising: two thermocouple wires; insulating material surrounding said thermocouple wires; a first outer sheath of ribbon material encasing said insulating material and said wires and having a first welded seam running longitudinally therealong; and a continuous and seamless second outer sheath encasing said first outer sheath and formed of material selected from the group comprising polytetrafluoroethylene, nylon and epoxy resins.

2. The improved thermocouple cable of claim 1 wherein the first ribbon material is selected from the group consisting of steel molybdenum.

3. The improved thermocouple cable of claim 1 wherein said insulating material is selected from the group consisting of MgO, $Al_2O_3$ and $Y_2O_3$.

4. The improved thermocouple cable of claim 3 wherein said insulating material is powdered Mg.

5. The improved thermocouple cable of claim 3 wherein said insulating material is pelletized MgO.

* * * * *